United States Patent
Ryu et al.

(10) Patent No.: US 7,350,296 B2
(45) Date of Patent: Apr. 1, 2008

(54) METHOD OF FABRICATING A PRINTED CIRCUIT BOARD INCLUDING AN EMBEDDED PASSIVE COMPONENT

(75) Inventors: Chang Sup Ryu, Daejeon (KR); Myung Sam Kang, Daejeon (KR)

(73) Assignee: Samsung Electro-Mechanics Co., Ltd., Kyunggi-Do (KR)

( * ) Notice: Subject to any disclaimer, the term of this patent is extended or adjusted under 35 U.S.C. 154(b) by 488 days.

(21) Appl. No.: 11/020,466

(22) Filed: Dec. 22, 2004

(65) Prior Publication Data

US 2006/0054352 A1 Mar. 16, 2006

(30) Foreign Application Priority Data

Sep. 15, 2004 (KR) .................... 10-2004-0073822

(51) Int. Cl.
*H01K 3/10* (2006.01)
(52) U.S. Cl. .................... 29/852; 29/621; 29/625; 29/829; 29/830; 29/846; 174/260; 174/262; 174/264; 174/266; 361/760; 361/761
(58) Field of Classification Search ............ 28/852, 28/621, 625, 829, 830, 846; 174/260, 262, 174/264, 266; 361/760, 761
See application file for complete search history.

(56) References Cited

U.S. PATENT DOCUMENTS 6,860,000 B2 * 3/2005 Felten .................... 29/610.1

7,242,591 B2 * 7/2007 Imamura et al. ............ 361/761

FOREIGN PATENT DOCUMENTS

| JP | 2002-198638 | 7/2002 |
| JP | 2004-95851 | 3/2004 |
| JP | 2004-134424 | 4/2004 |

OTHER PUBLICATIONS

Patent Abstracts of Japan for 2002-308158 filed on Oct. 23, 2002.
Patent Abstracts of Japan for 2000-266280 filed on Sep. 1, 2000.

* cited by examiner

*Primary Examiner*—Tim Phan
(74) *Attorney, Agent, or Firm*—Darby & Darby P.C.

(57) ABSTRACT

Disclosed is a method of fabricating a PCB including an embedded passive component and a method of fabricating the same and a method of fabricating the same. The PCB includes at least two circuit layers in which circuit patterns are formed. At least one insulating layer is interposed between the circuit layers. A pair of terminals is vertically formed through the insulating layers, plated with a first conductive material, and separated from each other by a predetermined distance. The embedded passive component is interposed between the terminals and has electrodes formed on both sides thereof. The electrodes are separated from the terminals by a predetermined distance and electrically connected to the terminals through a second conductive material.

8 Claims, 16 Drawing Sheets

METHOD OF FABRICATING A PRINTED CIRCUIT BOARD INCLUDING AN EMBEDDED PASSIVE COMPONENT

INCORPORATION BY REFERENCE

The present application claims priority under 35 U.S.C. §119 to Korean Patent Application No. 2004-73822 filed on Sep. 15, 2004. The content of the application is incorporated herein by reference in its entirety.

BACKGROUND OF THE INVENTION

1. Field of the Invention

The present invention relates, in general, to a printed circuit board (PCB) including an embedded passive component and a method of fabricating the same and, more particularly, to a PCB including an embedded passive component, in which the passive component is mounted in a predetermined receiving hole for communicating with via holes, and in which walls of the via holes are used as terminals connected to electrodes of the passive component, and a method of fabricating the same.

2. Description of the Prior Art

Recently, electronic technologies are moving toward the embedding of resistors, capacitors, integrated circuits (IC) or the like into a substrate so as to cope with demand for miniaturization and sophisticated functions of electronic goods according to advances in the electronics industry.

Typically, discrete chip resistors or discrete chip capacitors have been frequently mounted on most PCBs, but, recently, PCBs are developing in which passive components, such as resistors or capacitors, are embedded.

In other words, a technology for fabricating the PCBs including the passive components embedded therein, achieves substitution of conventional chip resistors or chip capacitors by mounting the passive components on an external part of a PCB or in an internal part of the PCB according to a novel process employing a novel material.

The PCB including the passive component embedded therein has a structure in which the passive component is mounted on the external part of the PCB or embedded in the internal part of the PCB, and if the passive component is integrated with the PCB to act as one part of the PCB regardless of the size of the PCB, the passive component is called an "embedded (buried) passive component" and the resulting PCB is called "printed circuit board including embedded passive component".

One of the most important features of the PCB including the passive component embedded therein is that since the passive components such as resistors or capacitors are already mounted as part of the PCB in the PCB, it is not necessary to mount additional passive components on a surface of the PCB.

FIGS. 1a to 1f are sectional views illustrating the fabrication of a conventional PCB including an embedded passive component, which is disclosed in Japanese Pat. Laid-Open Publication No. 2002-118366.

As shown in FIG. 1a, a groove 111 is formed on a core substrate 110 having a predetermined circuit pattern, and an adhesive 112 is applied to the bottom of the groove 111.

As shown in FIG. 1b, a chip capacitor 120 adheres to the bottom due to the adhesive 112.

As shown in FIG. 1c, a thermosetting resin is packed in the groove 111, heated and hardened to form a resin layer 113.

As shown in FIG. 1d, a thermosetting epoxy-based resin sheet is laminated on the core substrate 110, and then vacuum-pressed at 50-150° C. at a pressure of 5 kg/cm$^2$ to form a resin insulating layer 114.

As shown in FIG. 1e, the resin insulating layer 114 is bored using a laser to form via holes 115 connected to first and second electrodes 121 and 122 of the chip capacitor 120.

As shown in FIG. 1f, the PCB 110 including the embedded passive components (or capacitors) is created using a typical PCB build-up method.

In the conventional PCB 110 including the embedded passive component fabricated according to a procedure of FIGS. 1a to 1f, the via holes 115 connected to upper or lower sides of the first and second electrodes 121 and 122 must be formed to electrically connect a passive component chip (i.e. capacitor chip 120). However, since the upper or lower sides of the first and second electrodes 121 and 122 have a very small surface area, it is difficult to form the via holes 115.

Due to such a difficulty of formation of the via holes 115, the conventional PCB 110 including the embedded passive component is problematic in that portions of the via holes 115 are apt to be formed on a portion other than surfaces of the electrodes 121, 122, resulting in a short circuit, and in that the via holes 115 may not be connected to the electrodes 121, 122.

In conjunction with the above process in which the groove is formed on the PCB and the passive component is mounted in the groove, another process has been developed, in which passive components are laminated on both sides of an internal substrate.

FIGS. 2a to 2g are sectional views illustrating the fabrication of a conventional PCB including embedded passive components, which is disclosed in Japanese Pat. Laid-Open Publication No. 2004-146495.

As shown in FIG. 2a, a copper clad laminate 210 is provided, which includes a core substrate 211 and copper foil layers 212. Predetermined through holes. 213 are already formed through the copper clad laminate.

As shown in FIG. 2b, the upper and lower copper foil layers 212 of the copper clad laminate 210 are etched to form circuit patterns 214.

As shown in FIG. 2c, chip capacitors 220 adhere to the copper clad laminate 210 due to an adhesive.

As shown in FIG. 2d, conductive pastes 215 are applied according to a screen printing process to electrically connect electrodes at the sides of the chip capacitors 220 to the circuit patterns 214.

As shown in FIG. 2e, insulating layers 230 are formed on both sides of the substrate so as to embed the chip capacitors 220.

As shown in FIG. 2f, resin coated coppers (RCC) 240 in which resins 241 are applied on copper foils 242 are laminated on both sides of the substrate.

As shown in FIG. 2g, the PCB 200 including the embedded passive components (or capacitors) is created adopting a typical PCB build-up method.

The conventional PCB 200 including the embedded passive components fabricated according to a procedure of FIGS. 2a to 2g is problematic in that since the application of the conductive pastes 215 is implemented using the screen printing process in which there is a large tolerance, a short circuit readily occurs between the fine circuit patterns. This brings about an undesired electrical connection between the electrodes of the embedded passive components (i.e. chip capacitors 220) and circuit patterns, resulting in reduced reliability of the electronic goods.

SUMMARY OF THE INVENTION

Therefore, the present invention has been made keeping in mind the above disadvantages occurring in the prior arts, and an object of the present invention is to provide a PCB including an embedded passive component and a method of fabricating the same.

Another object of the present invention is to provide a PCB including an embedded passive component, in which a connection between the terminals of the embedded passive component and the PCB circuit patterns is easily and accurately achieved, and a method of fabricating the same.

The above objects can be accomplished by providing a PCB including an embedded passive component, which comprises at least two circuit layers in which circuit patterns are formed. At least one insulating layer is interposed between the circuit layers. A pair of terminals is vertically formed through the insulating layers, plated with a first conductive material, and separated from each other by a predetermined distance. The embedded passive component is interposed between the terminals and which has electrodes formed on both sides thereof. The electrodes are separated from the terminals by a predetermined distance, and electrically connected to the terminals through a second conductive material.

It is preferable that the first conductive material of the PCB be a copper plating layer.

It is preferable that the second conductive material of the PCB be a conductive paste.

It is preferable that the second conductive material of the PCB be a copper plating layer.

Furthermore, the present invention provides a PCB including an embedded passive component, which comprises an insulating layer having a receiving hole formed therein to receive the passive component. The embedded passive component is mounted in the receiving hole, and has a pair of electrodes formed on both sides thereof. A pair of terminals is formed on a wall of the receiving hole, and connected to the electrodes of the embedded passive component through a conductive material. A circuit pattern is connected to the terminals to transmit an electric signal.

Additionally, the present invention provides a method of fabricating a PCB including an embedded passive component, which comprises (A) forming a plurality of first via holes through a substrate, and forming copper plating layers on an external layer of the substrate and on walls of the first via holes; (B) forming first circuit patterns which include lands of the first via holes, on the external layer of the substrate and copper plating layers, and circuit patterns connected to the lands of the first via holes; (C) forming a receiving hole for receiving the passive component by removing a portion between the two first via holes of the plurality of first via holes so that the two via holes communicate with each other; (D) mounting the passive component in the receiving hole; and (E) electrically connecting a portion of the two first via holes, which is not removed, to electrodes of the passive component.

It is preferable that the method further comprises (F) laminating an insulating layer on one side of the substrate after the step (B).

It is preferable that the method further comprises (F) laminating an insulating layer on one side of the substrate after the step (C).

It is preferable that the method further comprises (F) laminating first laminates, which each include a first insulating layer and a first copper foil, on both sides of the substrate, and forming second circuit patterns on the first copper foil of each of the first laminates after the step (B); and (G) laminating second laminates, which each include a second insulating layer and a second copper foil, on the first laminates, and forming second via holes so as to expose a portion of the two first via holes that is not removed, and the electrodes of the passive component after the step (D).

It is preferable that the portion of the first via holes that is not removed, is electrically connected to the electrodes of the passive component using a conductive paste in the step (E) of the method.

It is preferable that the portion of the first via holes that is not removed, is electrically connected to the electrodes of the passive component using the copper plating layers in the step (E) of the method.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1A:
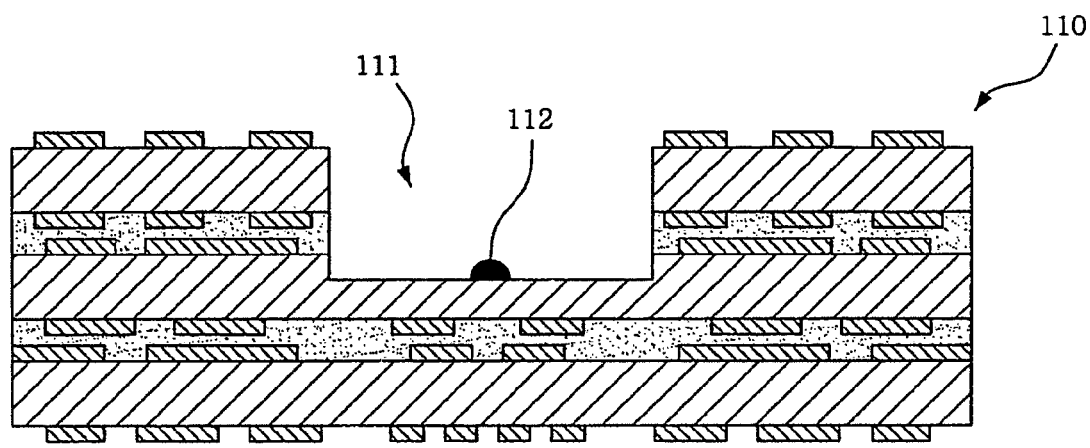
FIGS. 1a to 1f are sectional views illustrating the fabrication of a conventional PCB including an embedded passive component.
Figure 1B:
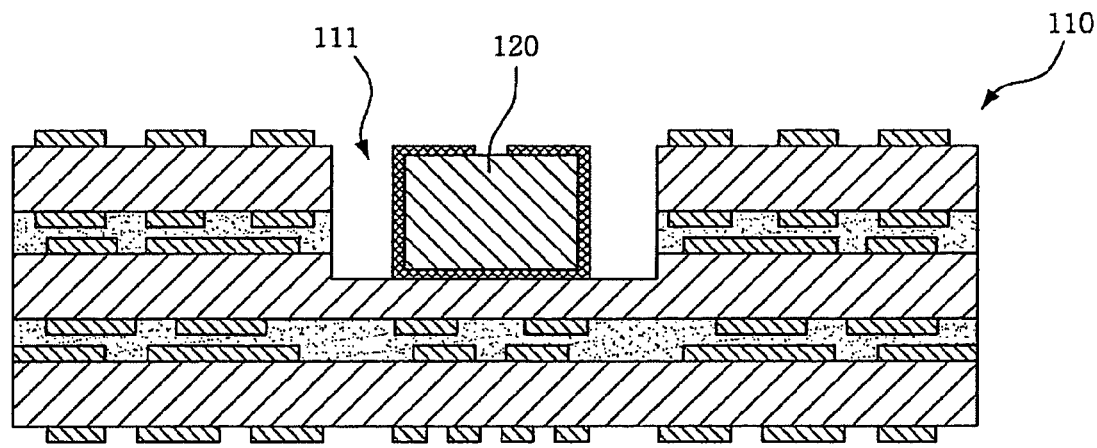
Figure 1C:
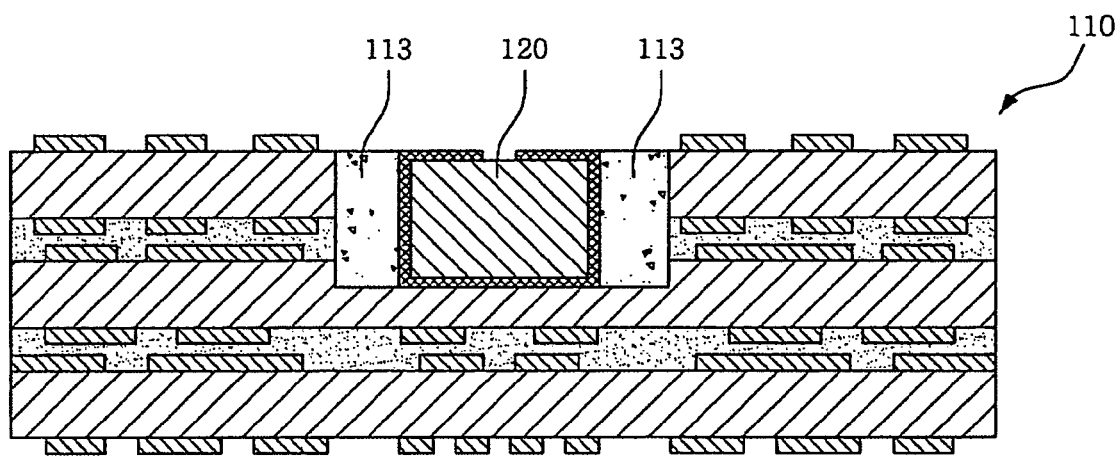
Figure 1D:
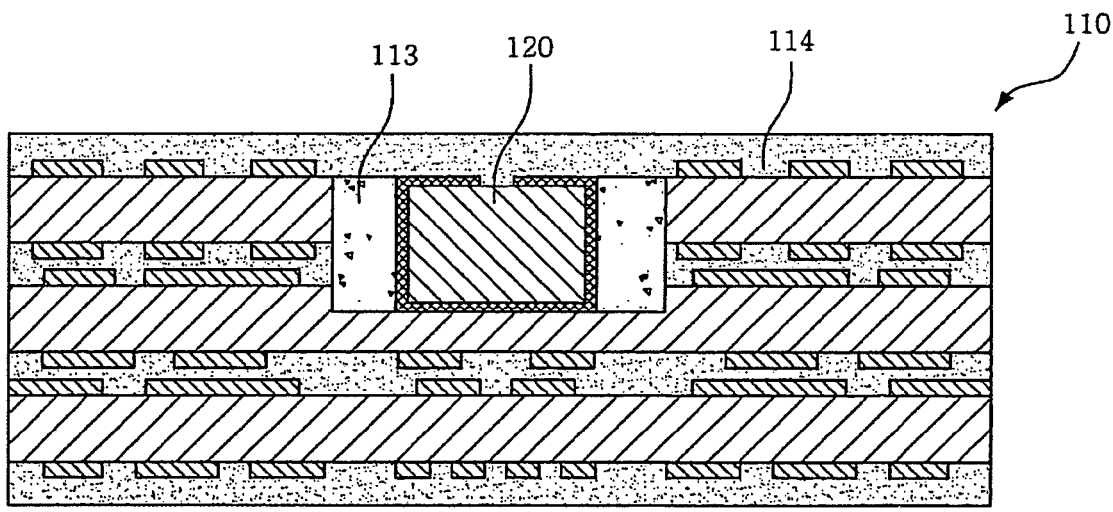
Figure 1E:
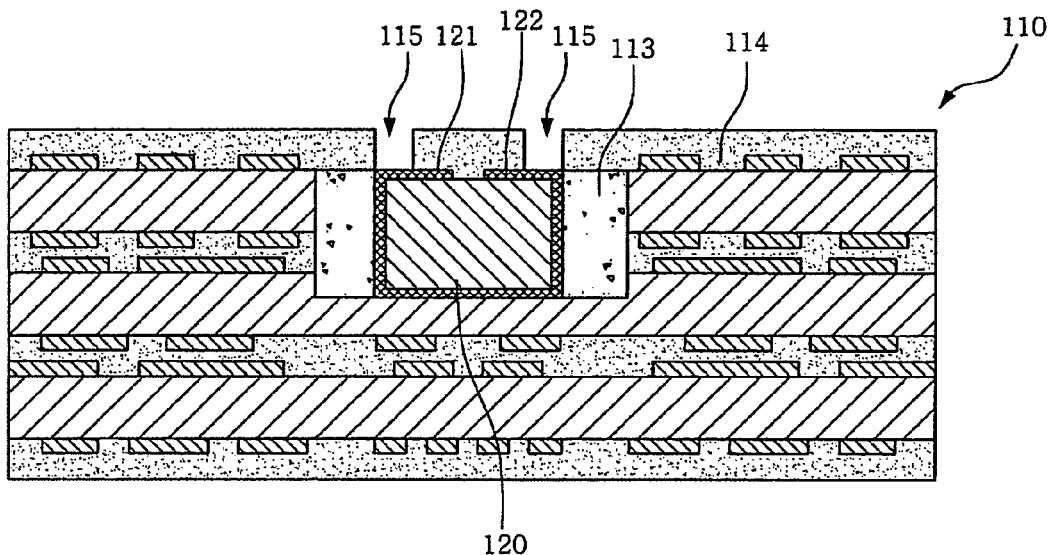
Figure 1F:
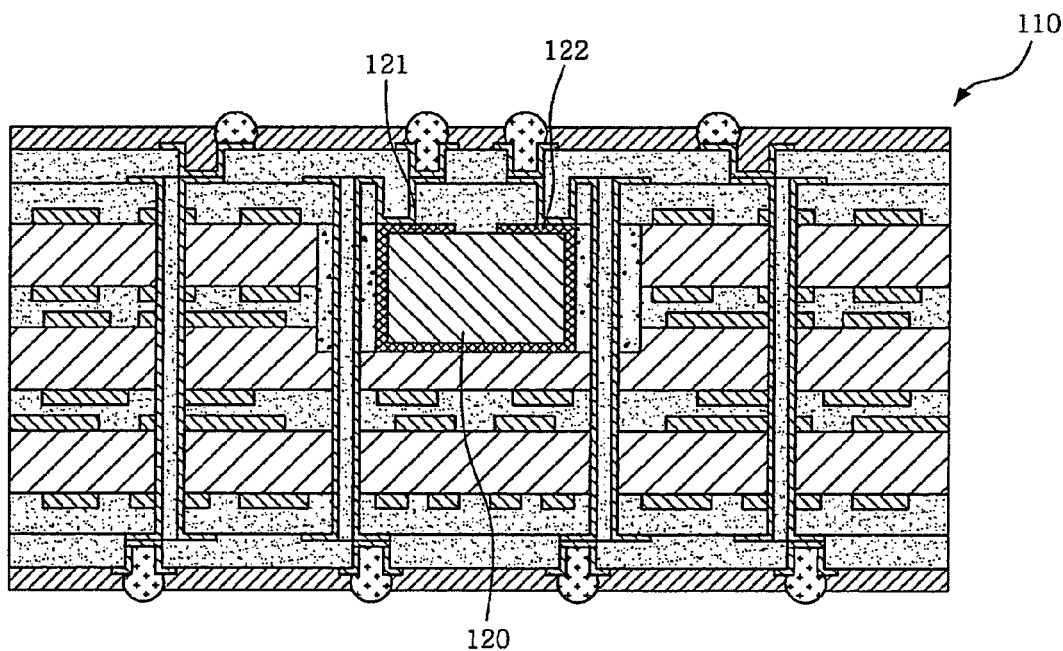
Figure 2A:
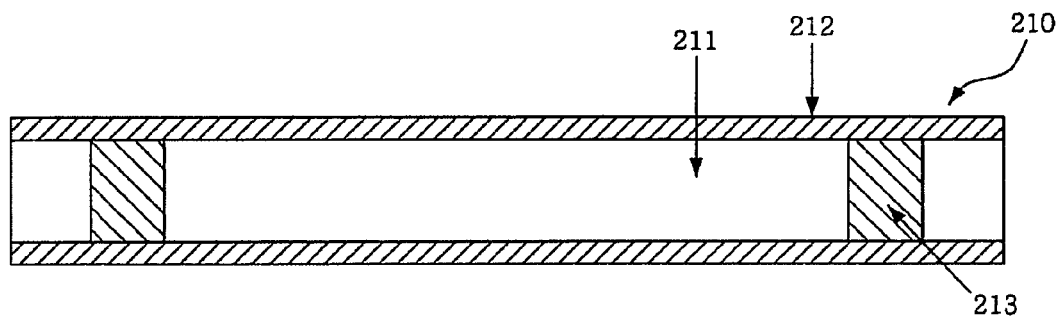
FIGS. 2a to 2g are sectional views illustrating another fabrication of a conventional PCB including embedded passive components.
Figure 2B:
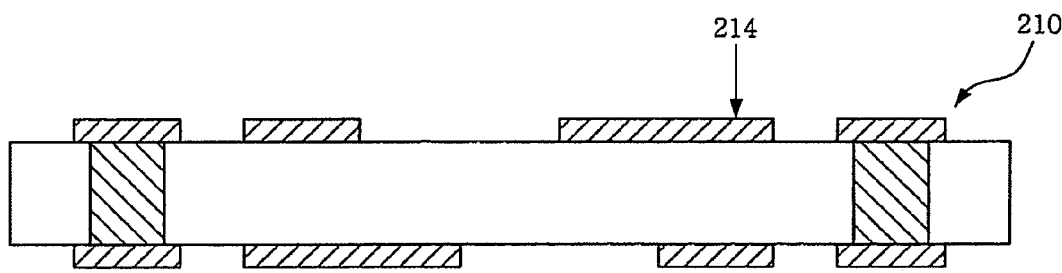
Figure 2C:
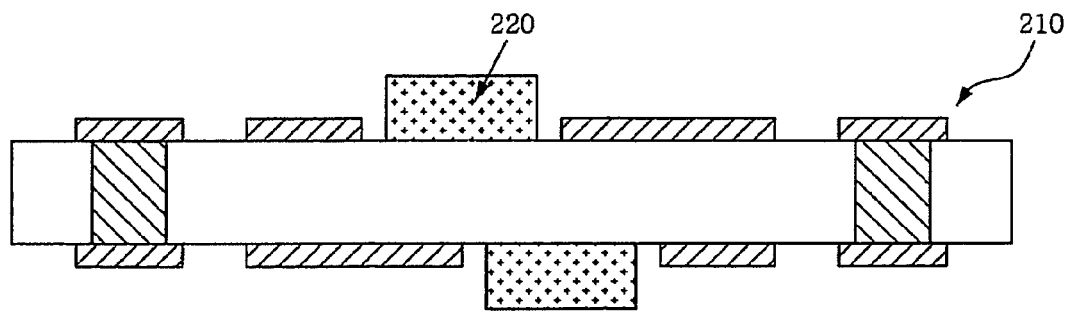
Figure 2D:
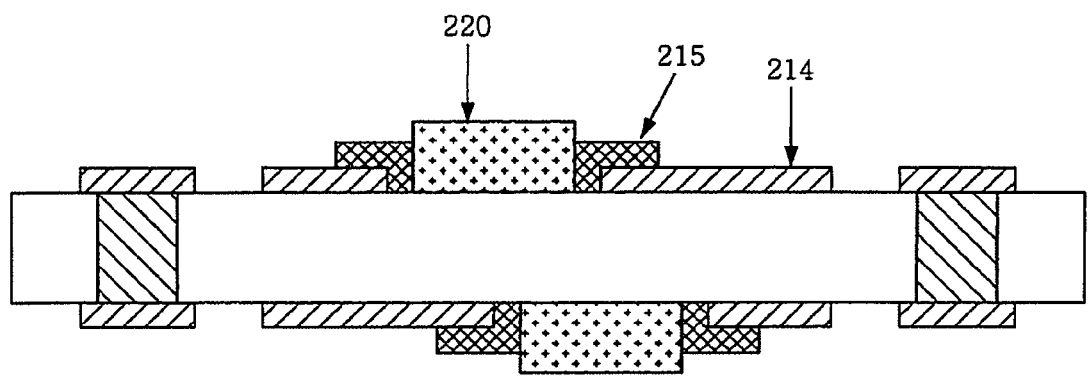
Figure 2E:
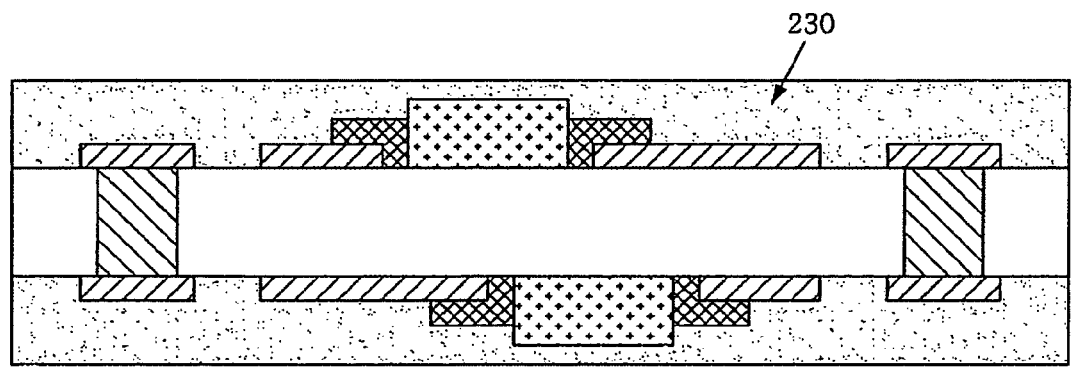
Figure 2F:
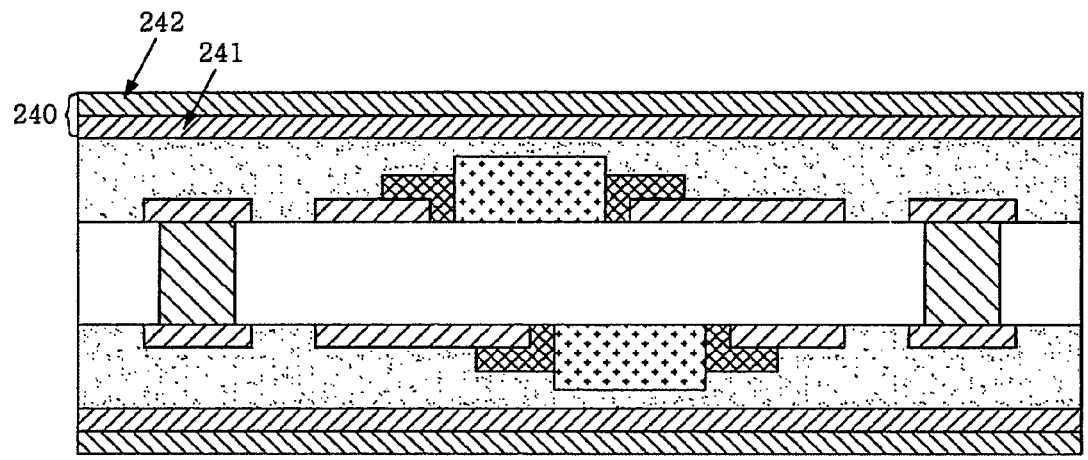
Figure 2G:
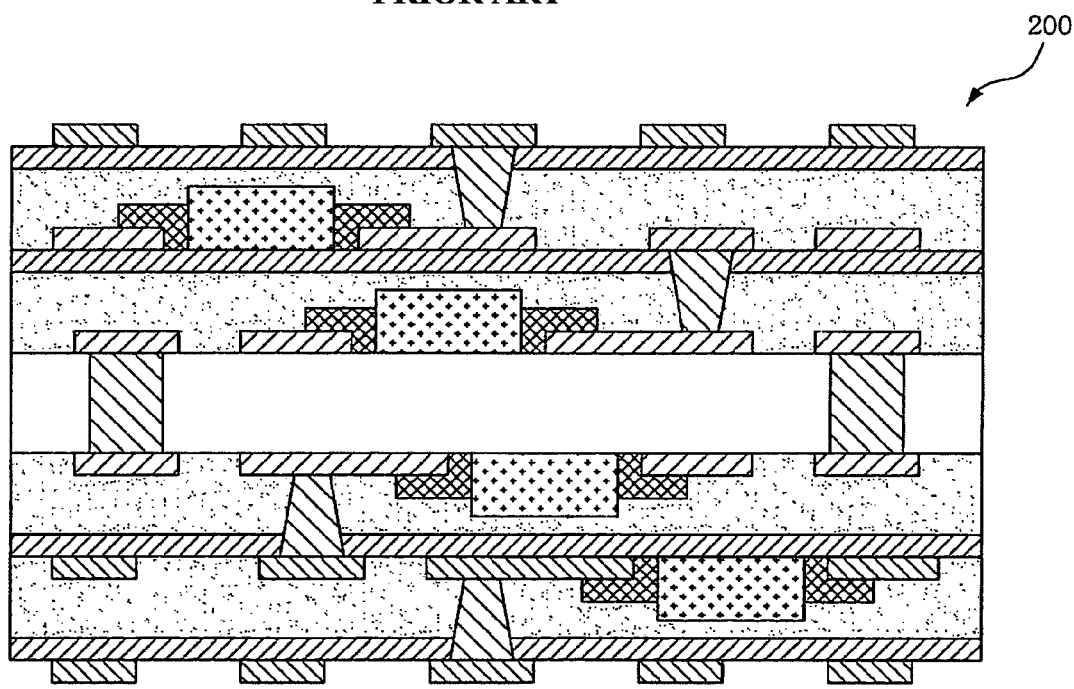

Hereinafter, a detailed description will be given of a PCB including embedded passive components and a method of fabricating the same according to the present invention, referring to the drawings.

FIGS. 3a to 3j are sectional and top views illustrating the fabrication of a PCB including an embedded passive component according to an embodiment of the present invention.

Figure 3A:
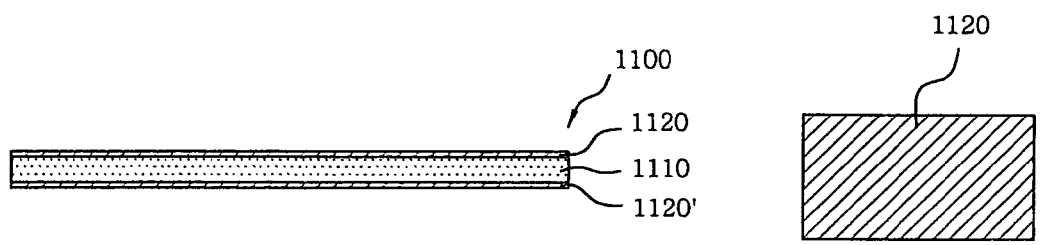
FIGS. 3a to 3j are sectional and top views illustrating the fabrication of a PCB including an embedded passive component according to the first embodiment of the present invention.

As shown in FIG. 3a, a copper clad laminate as a substrate 1100 is provided, in which copper foil layers 1120, 1120' are applied on an insulating resin layer 1110.

In this respect, the copper clad laminate used as the substrate 1100 may be classified into a glass/epoxy copper clad laminate, a heat-resistant resin copper clad laminate, a paper/phenol copper clad laminate, a high-frequency copper clad laminate, a flexible copper clad laminate, and a composite copper clad laminate depending on the application. However, it is preferable to use the glass/epoxy copper clad laminate in which the copper foil layers 1120, 1120' are applied on the insulating resin layer 1110, which is most frequently adopted in the course of fabricating a PCB.

The substrate 1100 having a two-layered structure is described in the first embodiment, but a substrate 1100 having a multi-layered structure, such as a four-, six-, or eight-layered structure, in which predetermined circuit patterns are formed on an internal circuit layer, may be used depending on the purpose and application.

Figure 3B:
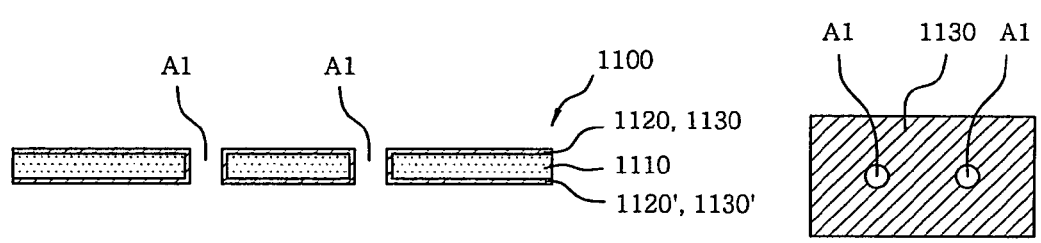

As shown in FIG. 3b, after two via holes (A1) are formed to achieve circuit connection between the upper and lower copper foil layers 1120, 1120' of the substrate 1100, copper plating layers 1130, 1130' are formed on the upper and lower copper foil layers 1120, 1120' and on walls of the via holes (A1) so as to electrically connect the via holes (A1) to each other.

At this time, since each of the via holes (A1) formed through the substrate 1100 is a through hole connecting the copper foil layers 1120, 1120' to each other, it is preferable to form the via holes (A1) at predetermined positions using a mechanical drill such as a computer numerical control drill (CNC drill).

After the via holes (A1) are formed using the CNC drill, it is preferable that a deburring process be conducted to remove burrs, generated during the drilling process, from copper foil layers 1120, 1120', and dust adhering to the walls of the via holes (A1) and to surfaces of the copper foil layers 1120, 1120'. At this time, the surfaces of the copper foil layers 1120, 1120' become rough, thus improving the attachment strength of copper to the copper foil layers in a copper plating process.

Furthermore, after formation of the via holes (A1) using the CNC drill, it is preferable to conduct a desmear process so as to remove a smear which is formed on the walls of the via holes (A1) by melting the insulating resin layer 1110 due to heat generated in the course of forming the via holes.

Meanwhile, the walls of the via holes (A1) of the substrate 1100 each comprise the insulating resin layer 1110, and thus, it is impossible to conduct an electrolytic copper plating process immediately after the via holes (A1) are formed.

Accordingly, an electroless copper plating process is carried out so as to electrically connect the via holes (A1) to each other and to achieve an electrolytic copper plating process. Since the electroless copper plating process is a process of plating an insulator, it is difficult to expect a reaction caused by ions with electricity. The electroless copper plating process is achieved by a deposition reaction, and the deposition reaction is promoted by a catalyst. The catalyst must be attached to a surface of a material to be plated, so as to separate copper from a plating solution to deposit copper on the material. This means that the electroless copper plating process requires many pre-treating processes.

For example, the electroless copper plating process may include a degreasing step, a soft etching step, a pre-catalyst treating step, a catalyst treating step, an acceleration step, an electroless copper plating step, and an anti-oxidizing step.

In the degreasing step, oxides, impurities, and, particularly, oils and fats are removed from surfaces of the upper and lower copper foil layers 1120, 1120' using a chemical containing acid or alkaline surfactants, and the resulting copper foil layers are rinsed to completely remove the surfactants therefrom.

The soft etching step makes the surfaces of the upper and lower copper foil layers 1120, 1120' slightly rough (for example, a roughness of about 1-2 μm) to uniformly deposit copper particles on the copper foil layers during the plating process, and contaminants which are not removed during the degreasing step are removed from the copper foil layers.

In the pre-catalyst treating step, the substrate 1100 is dipped in a dilute first catalyst-containing chemical solution to prevent a second catalyst-containing chemical solution used in the catalyst treating step from becoming contaminated and to prevent the concentration of the second catalyst-containing chemical solution from changing. Moreover, because the substrate 1100 is preliminarily dipped in the first chemical solution, having the same components as the second chemical solution, prior to treating the substrate 1100 using the second chemical solution, the treating of the substrate 110 using the catalyst is more effectively achieved. At this time, it is preferable that a 1-3% chemical concentration be used in the pre-catalyst treating step.

In the catalyst treating step, catalyst particles are applied to the copper foil layers 1120, 1120' and insulating resin layer 1110 (i.e. the walls of the via holes (A1)) of the substrate 1100. The catalyst particles may be preferably exemplified by a Pd—Sn compound, and $Pd^{2-}$ dissociated from the Pd—Sn compound promotes the plating of the substrate 1100 in conjunction with $Cu^{2+}$ plated on the substrate 1100.

During the electroless copper plating step, it is preferable that a plating solution contain $CuSO_4$, HCHO, NaOH, and a stabilizer. It is important to control the composition of the plating solution because chemical reactions constituting the plating process of the substrate 1100 must maintain an equilibrium state in order to continuously conduct the plating process. To desirably maintain the composition of the plating solution, it is necessary to properly replenish each component constituting the plating solution, to mechanically agitate the plating solution, and to smoothly operate a cycling system of the plating solution. Furthermore, it is necessary to use a filtering device to remove byproducts resulting from the reaction, and the removal of the byproducts using the filtering device helps extend of the life of the plating solution.

An anti-oxidizing layer is applied to the copper foils to prevent oxidation of the copper foils by alkaline components remaining after the electroless copper plating step during the anti-oxidizing step.

However, since an electroless copper-plating layer usually has poorer physical properties than an electrolytic copper-plating layer, the electroless copper-plating layer is thinly formed.

After the completion of the electroless copper plating process, the substrate 1100 is dipped into a copper plating tub, and the electrolytic copper plating process is then conducted using a D.C. rectifier. Preferably, the electrolytic copper plating process is conducted in such a way that after an area to be plated is calculated, a proper amount of electricity is applied to the D.C. rectifier to achieve the deposition of copper.

The electrolytic copper plating process is advantageous in that physical properties of the electrolytic copper-plating layer are superior to those of the electroless copper-plating layer and it is easy to form a thick copper plating layer.

Figure 3C:
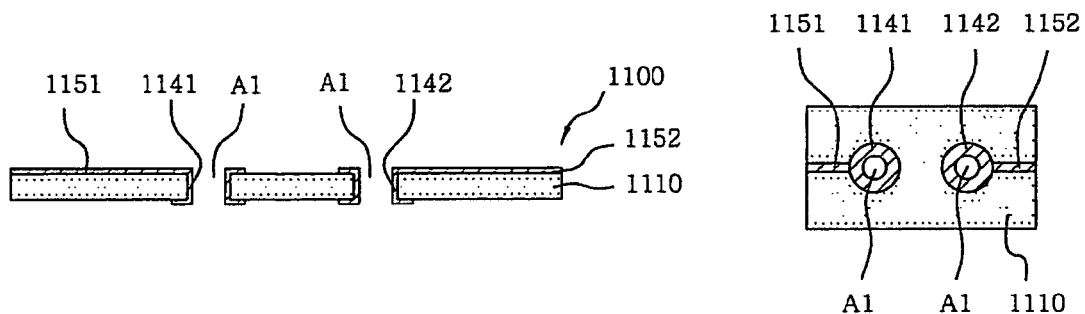

As shown in FIG. 3c, exposure, development, and etching processes are conducted using an etching resist made of a photosensitive material to form predetermined circuit patterns on the upper and lower copper foil layers 1120, 1120' and copper plating layers 1130, 1130' of the substrate 1100. The predetermined circuit patterns include traditional circuit patterns (not shown), lands of the via holes as a portion of the terminals 1141, 1142, and circuit patterns 1151, 1152 connected to the terminals 1141, 1142.

In the first embodiment, examples of the etching resist made of the photosensitive material may include a dry film or a liquid photosensitive substance.

When the dry film is used as the etching resist, after the dry film is applied to the upper and lower copper plating layers 1130, 1130' of the substrate 1100, an artwork film having a predetermined pattern printed thereon adheres to the dry film, followed by the irradiation of ultraviolet light. Ultraviolet light is not transmitted through a black portion of the artwork film, which corresponds to the predetermined pattern, but through a remaining portion of the artwork film, on which the pattern is not printed, to harden the dry film under the artwork film. The substrate 1100 on which the dry film is hardened is dipped in a developing solution for removal of the unhardened portion of the dry film by the developing solution. The remaining hardened portion of the dry film forms an etching resist pattern. In this regard, examples of the developing solution include a sodium carbonate ($Na_2CO_3$) aqueous solution and a potassium carbonate ($K_2CO_3$) aqueous solution. Next, the dry film is used as an etching resist, and an etchant is sprayed onto the substrate 1100 to remove the portion of the upper and lower copper foil layers 1120, 1120' and copper plating layers 1130, 1130' that is not coated with the predetermined pattern of the dry film. Subsequently, the dry film applied on upper and lower sides of the substrate 1100 is stripped and removed using a stripping solution, including sodium hydroxide (NaOH) or potassium hydroxide (KOH).

Meanwhile, when the liquid photosensitive substance is used as the etching resist, the liquid photosensitive substance, which is to be exposed to ultraviolet light, is applied to the copper plating layers 1130, 1130' of the substrate 1100, and then dried. In this regard, the liquid photosensitive substance is applied by a dip coating process, a roll coating process, an electro-depositing process or the like. Subsequently, the photosensitive substance is exposed and developed using the patterned artwork film, thereby forming a predetermined pattern thereon. Next, the patterned photosensitive substance is used as the etching resist, and the etchant is sprayed onto the substrate 1100 to remove the portion of the upper and lower copper foil layers 1120, 1120' and copper plating layers 1130, 1130' that is not coated with the photosensitive substance in a predetermined pattern. Next, the photosensitive substance is removed.

Compared to the use of the dry film, the use of the liquid photosensitive substance as the etching resist is advantageous in that since it is possible to achieve a thinner coated layer, finer circuit patterns can be formed. Another advantage is that when a surface of the substrate 1100 is uneven, it is possible to flatten the surface by filling the receiving holes.

Figure 3D:
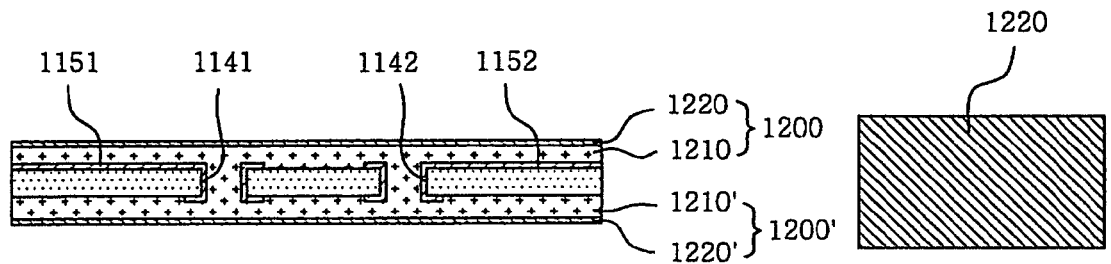

As shown in FIG. 3d, first insulating layers 1210, 1210' (for example, prepregs and first copper foils 1220, 1220') are laminated on both sides of the substrate 1100, and heated and pressed at a predetermined temperature and pressure (for example, about 150-200° C. and 30-40 kg/cm$^2$) to form first laminates 1200, 1200'.

At this stage, instead of the first insulating layers 1210, 1210' and first copper foils 1220, 1220', first resin coated coppers (RCC) may be laminated on both sides of the substrate 1100 to form the first laminates 1200, 1200'.

Figure 3E:
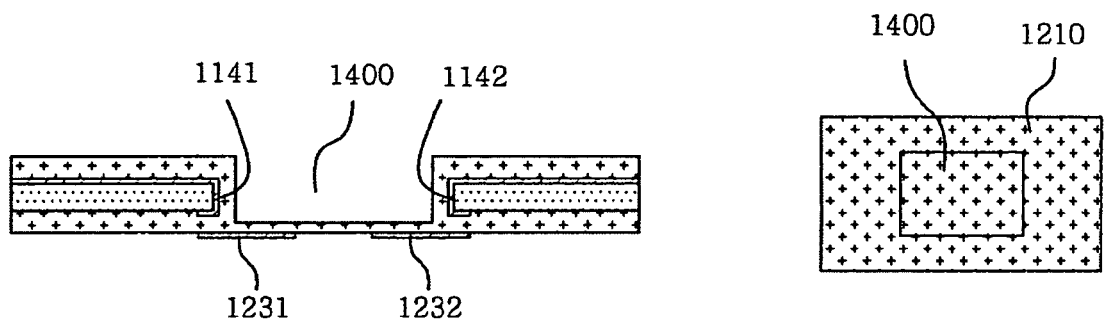

As shown in FIG. 3e, the upper and lower first copper foils 1220, 1220' of the first laminates 1200, 1200' are exposed, developed, and etched using an etching resist made of a photosensitive material to form predetermined circuit patterns thereon. Thereafter, a portion between the two via holes is processed to form a receiving hole 1400 for receiving a passive component. At this stage, it is preferable to form the receiving hole 1400 so that half of each via hole is removed.

When the via holes are formed using a laser to connect the electrodes of the passive component to the terminals 1141, 1142 of the passive component during the formation of the predetermined circuit patterns, lower lands 1231, 1232 of the via holes are formed on a lower side of the lower first copper foil 1220' to prevent the via holes from being over-etched.

As in the procedure of FIG. 3c, it is preferable to form the predetermined circuit patterns using a dry film or a liquid photosensitive substance as the etching resist.

Furthermore, in this embodiment, the copper plating layers remain on opposite arciform wall portions of the via holes positioned outside the receiving hole 1400 for receiving the passive component because the portions are not processed. Accordingly, the arciform portions act as the terminals 1141, 1142 connected to the electrodes of the passive component.

It is preferable to drill the portion of the substrate between the two via holes (A1) using a CNC drill, a router drill, or the like, so that a fine tolerance of the passive component to be mounted in the receiving hole is achieved.

Figure 3F:
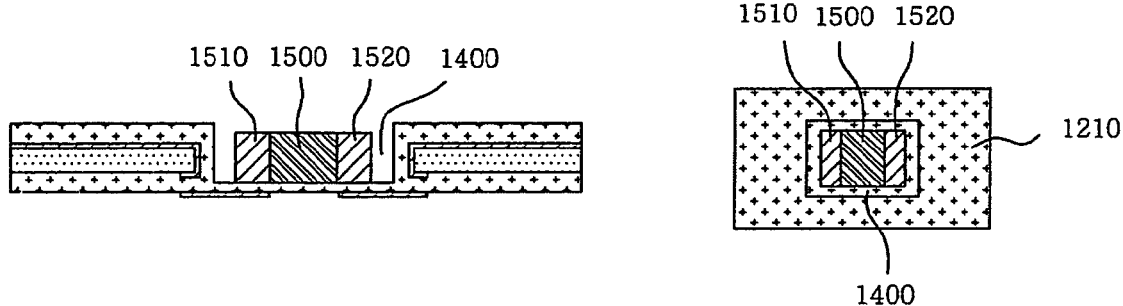

As shown in FIG. 3f, the passive component 1500, such as a chip capacitor or a chip resistor, is mounted in the receiving hole 1400 for receiving the passive component.

In this respect, it is preferable to mount the passive component 1500 in the receiving hole after the small amount of adhesive is applied in the bottom of the receiving hole 1400, so that the passive component 1500 is firmly fixed and remains in the correct position during subsequent processes.

Figure 3G:
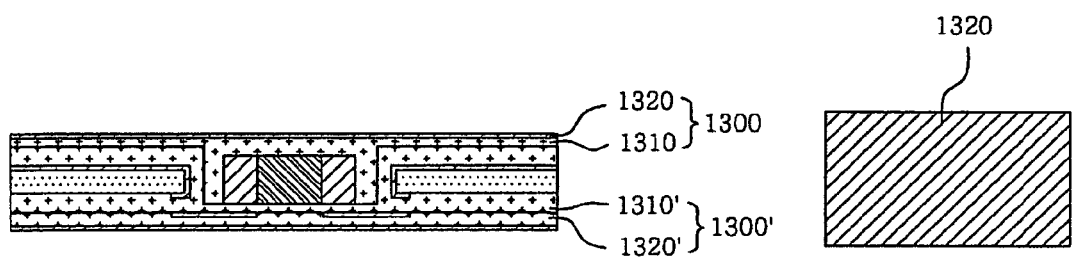

As shown in FIG. 3g, second insulating layers 1310, 1310' (for example, prepregs) and second copper foils 1320, 1320' are laminated on both sides of the substrate, heated and pressed at a predetermined temperature and pressure (for example, about 150-200° C. and 30-40 kg/cm$^2$) to form second laminates 1300, 1300'.

As in the first laminates 1200, 1200' of FIG. 3d, instead of the second insulating layers 1310, 1310' and second copper foils 1320, 1320', second RCCs may be laminated on both sides of the substrate to form the second laminates 1300, 1300'.

Figure 3H:
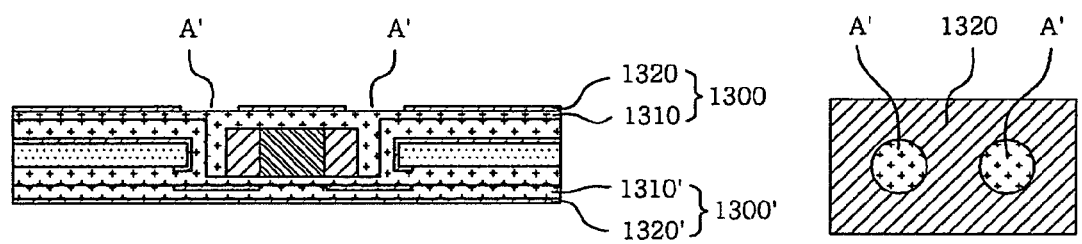

As shown in FIG. 3h, the upper second copper foil 1320 is exposed, developed, and etched using an etching resist made of a photosensitive material to form windows (A') for formation of the via holes.

Figure 3I:
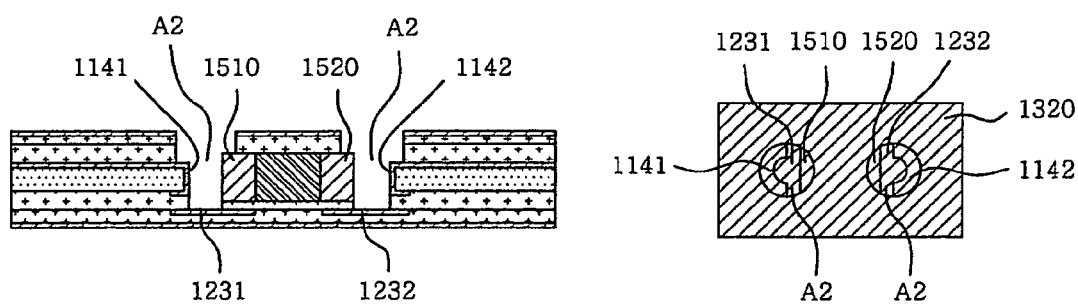

As shown in FIG. 3i, via holes (A2) are formed from the upper second copper foil 1320 to the lower via hole lands 1231, 1232 formed on the lower first copper foil 1220' of the first laminate 1200' using the windows (A') formed through the upper second copper foil 1320.

Since each of the via holes (A2) is a blind via hole with a lower end closed, it is preferable to drill the insulating layers 1210, 1210', 1310 using a laser drill to form the via holes (A2). At this time, preferable examples of the laser drill include a $CO_2$ laser drill. In this respect, since the electrodes 1510, 1520 of the passive component and terminals 1141, 1142, that is, walls of the via holes (A1), consist of copper which is not drilled by a carbon dioxide laser drill, the electrodes 1510, 1520 of the passive component and terminals 1141, 1142 act as a guide used to process the via holes (A2).

Furthermore, the lands 1231, 1232 made of copper constitute bottoms of the via holes (A2), and thus, the insulating layers are precisely drilled to the lands 1231, 1232, thereby assuring precise formation of the via holes (A2).

Figure 3J:
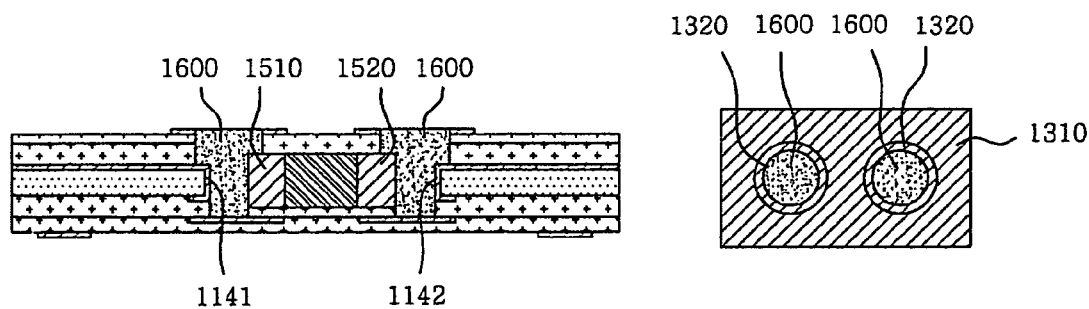

As shown in FIG. 3j, in order to electrically connect the terminals 1141, 1142 to the electrodes 1510, 1520 of the passive component, after a conductive paste 1600 is packed into the via holes (A2), exposure, development, and etching processes are conducted using an etching resist made of a photosensitive material, thereby forming predetermined circuit patterns on the upper and lower second copper foils 1320, 1320'.

It is preferable that a dry film or a liquid photosensitive substance be used as the etching resist made of the photosensitive material to form the predetermined circuit patterns.

Figure 4A:
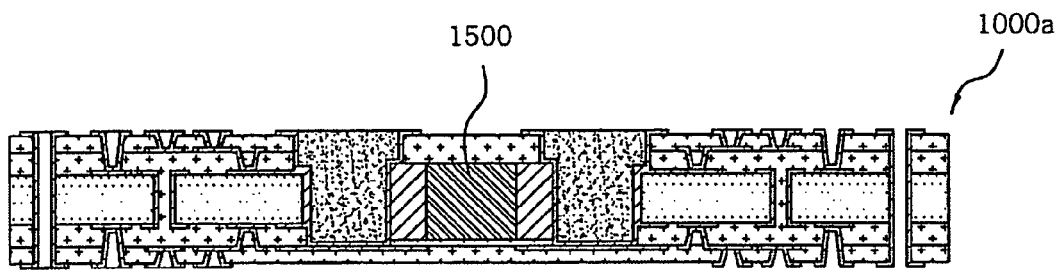
FIGS. 4a and 4b are sectional views of six- and eight-layered PCBs including embedded passive components, respectively, according to an embodiment of the present invention.
Figure 4B:
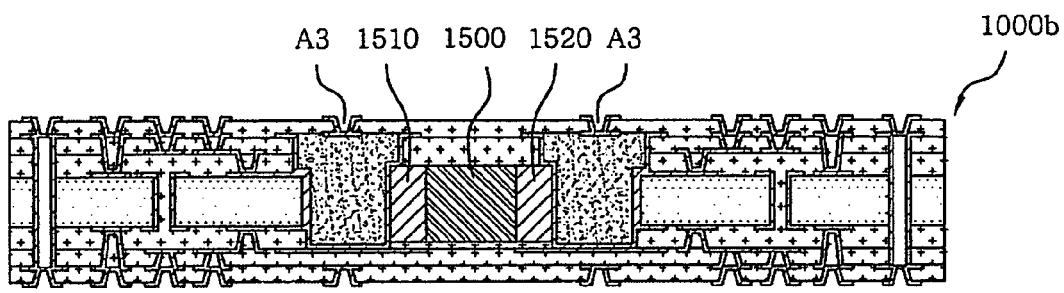

FIGS. 4a and 4b are sectional views of six- and eight-layered PCBs including embedded passive components according to the embodiment of the present invention, respectively.

As shown in FIG. 4a, the present invention may provide the six-layered PCB 1000a including the embedded passive component, in which the embedded passive component 1500 and traditional circuit patterns are formed simultaneously.

Furthermore, as shown in FIG. 4b, the present invention may provide the eight-layered PCB 1000b including the embedded passive component, in which the embedded passive component 1500 and traditional circuit patterns are formed simultaneously.

At this time, via holes (A3) may be formed on other via holes in which a conductive paste 1600 is already packed. Thus, electrodes 1510, 1520 of the passive component may be connected to other circuit layers.

The six- and eight-layered PCBs 1000a, 1000b including the embedded passive components are described in the first embodiment. However, as will be appreciated by those skilled in the art, the present invention may provide a PCB comprising eight or more layers and including an embedded passive component.

Figure 5:
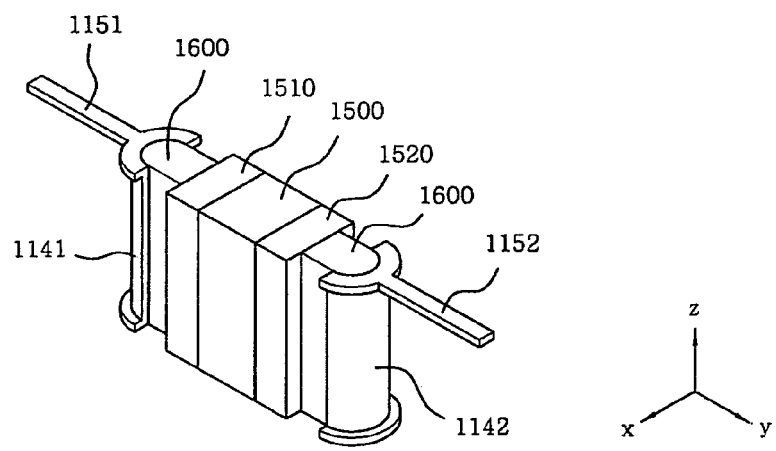
FIG. 5 is a perspective view of the embedded passive component according to the embodiment of the present invention.

FIG. 5 is a perspective view of the embedded passive component according to the embodiment of the present invention.

As shown in FIG. 5, the embedded passive component 1500 according to the present invention is embedded in an insulating layer of a PCB including the embedded passive component, and has electrodes 1510, 1520 formed on both sides thereof. The electrodes 1510, 1520 of the passive component are electrically connected through a conductive paste 1600 to terminals 1141, 1142 separated therefrom by a predetermined distance. The terminals 1141, 1142 are portions of walls of the via holes each having a semi-cylinder shape, and a copper plating layer is formed on the walls of the via holes to be electrically connected to circuit patterns 1151, 1152.

FIGS. 6a to 6j are sectional and top views illustrating the fabrication of a PCB including an embedded passive component according to the second embodiment of the present invention.

Figure 6A:
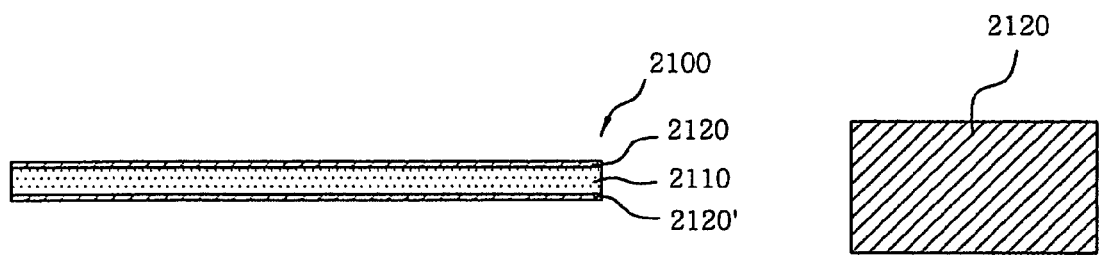
FIGS. 6a to 6j are sectional and top views illustrating the fabrication of a PCB including an embedded passive component according to another embodiment of the present invention.

As shown in FIG. 6a, a copper clad laminate as a substrate 2100 is provided, in which copper foil layers 2120, 2120' are applied on an insulating resin layer 2110.

In this case, only a two-layered substrate 2100 is employed. However, a substrate 2100 having a multi-layered structure, such as four-, six-, or eight-layered structures, may be used depending on the purpose and application.

Figure 6B:
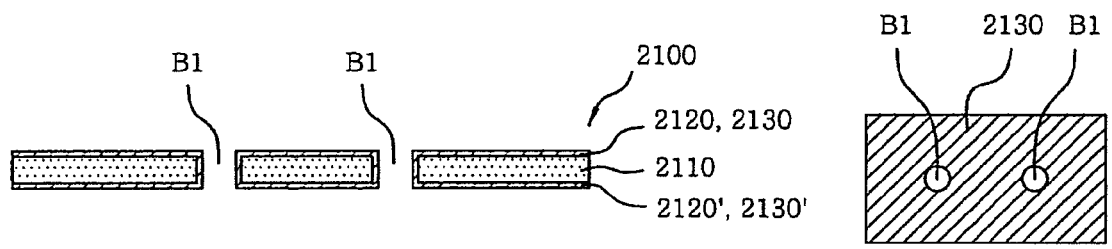

As shown in FIG. 6b, after two via holes (B1) are formed to achieve circuit connection between the upper and lower copper foil layers 2120, 2120' of the substrate 2100, copper plating layers 2330, 2330' are formed on the upper and lower copper foil layers 2120, 2120' and on walls of the via holes (B1) so as to electrically connect the via holes (B1) to each other.

It is preferable to form the via holes (B1) through the substrate 2100 at predetermined positions using a mechanical drill such as a computer numerical control drill (CNC drill).

Furthermore, after the via holes (B1) are formed, it is preferable that a deburring process be conducted to remove burrs, generated during the drilling process, from the copper foil layers 2120, 2120', and dust adhering to the walls of the via holes (B1) and to surfaces of the copper foil layers 2120, 2120'. Additionally, it is preferable to conduct a desmear process so as to remove a smear which is formed on the walls of the via holes (B1) due to melting of the insulating resin layer 2110 by heat generated in the course of forming the via holes (B1).

Meanwhile, the walls of the via holes (B1) of the substrate 2100 each comprise the insulating resin layer 2110, and thus, it is preferable to form copper plating layers 2130, 2130' in such a way that an electrolytic copper plating process is conducted after the completion of an electroless copper plating process. At this time, physical properties of an electrolytic copper-plating layer are superior to those of an electroless copper-plating layer.

Figure 6C:
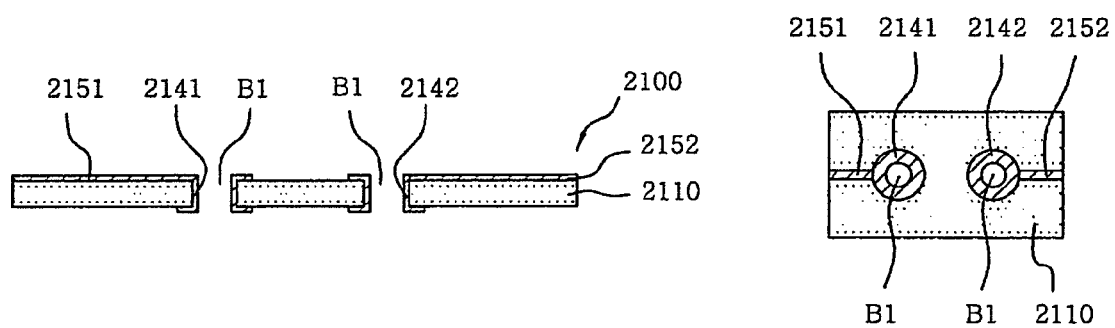

As shown in FIG. 6c, exposure, development, and etching processes are conducted using an etching resist made of a photosensitive material to form predetermined circuit patterns on the upper and lower copper foil layers 2120, 2120' and copper plating layers 2330, 2330' of the substrate 2100. The predetermined circuit patterns include traditional circuit patterns (not shown), lands of the via holes (B1) as a portion of terminals 2141, 2142, and circuit patterns 2151, 2152 connected to the terminals 2141, 2142.

It is preferable that a dry film or a liquid photosensitive substance be used as the etching resist made of the photosensitive material to form the predetermined circuit patterns.

Figure 6D:
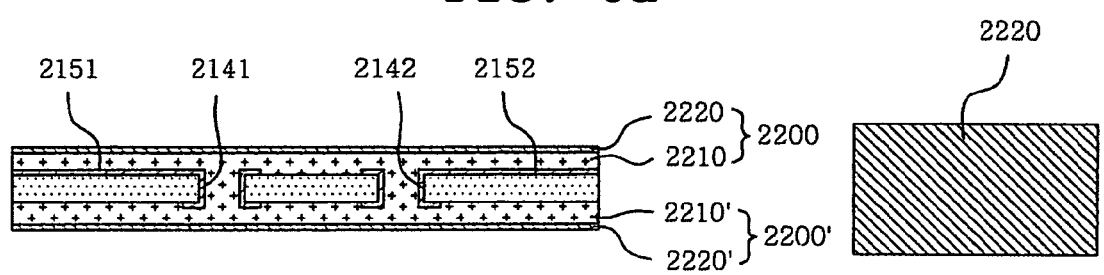

As shown in FIG. 6d, first insulating layers 2210, 2210' (for example, prepregs) and first copper foils 2220, 2220' are laminated on both sides of the substrate 2100, and heated and pressed at a predetermined temperature and pressure (for example, about 150-200° C. and 30-40 kg/cm²) to form first laminates 2200, 2200'.

At this stage, instead of the first insulating layers 2210, 2210' and first copper foils 2220, 2220', first resin coated coppers (RCC) may be laminated on both sides of the substrate 2100 to form the first laminates 2200, 2200'.

Figure 6E:
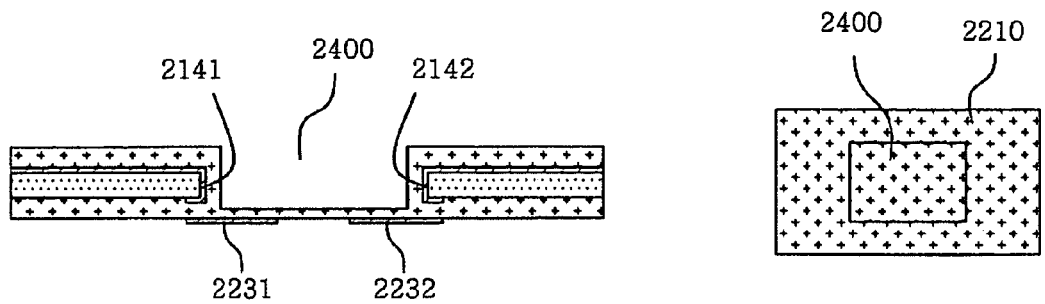

As shown in FIG. 6e, the upper and lower first copper foils 2220, 2220' of the first laminates 2200, 2200' are exposed, developed, and etched using the etching resist made of the photosensitive material to form predetermined circuit patterns thereon. Thereafter, a portion between the two via holes (B1) is processed to form a receiving hole 2400 for receiving a passive component. It is preferable to form the receiving hole 2400 so that half of each via hole is removed.

When the via holes are formed using a laser to connect the electrodes of the passive component to the terminals 2141, 2142 of the passive component during the formation of the predetermined circuit patterns, lower lands 2231, 2232 of the via holes are formed on a lower side of the lower copper foil to prevent the via holes from being over-etched.

As in the procedure of FIG. 6c, it is preferable to form the predetermined circuit patterns using a dry film or a liquid photosensitive substance as an etching resist.

Furthermore, in the second embodiment, the copper plating layers remain on opposite arciform wall portions of the two via holes positioned outside the receiving hole 2400 for receiving the passive component, because the portions are not processed. Accordingly, the arciform portions act as the terminals 2141, 2142 connected to the electrodes of the passive component.

It is preferable to drill the portion of the substrate between the two via holes using a CNC drill, a router drill, or the like, so that the tolerance of the passive component to be mounted in the receiving hole is satisfied.

Figure 6F:
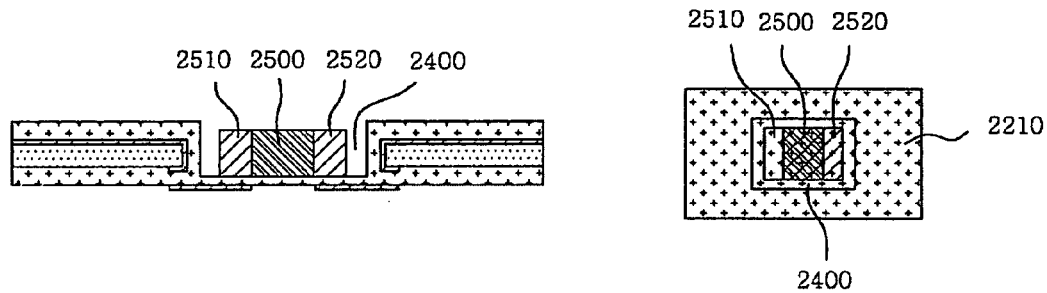

As shown in FIG. 6f, the passive component 2500, such as a chip capacitor or a chip resistor, is mounted in the receiving hole 2400 for receiving the passive component.

In this respect, it is preferable to mount the passive component 2500 in the receiving hole after a small amount of adhesive is applied in the bottom of the receiving hole 2400, so that the passive component 2500 is firmly fixed and remains in the correct position during subsequent processes.

Figure 6G:
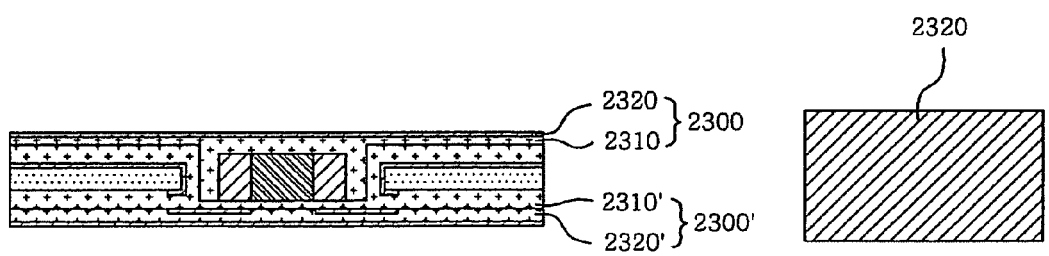

As shown in FIG. 6g, second insulating layers 2310, 2310' (for example, prepregs) and second copper foils 2320, 2320' are laminated on both sides of the substrate, heated and pressed at a predetermined temperature and pressure (for example, about 150-200° C. and 30-40 kg/cm$^2$) to form second laminates 2300, 2300'.

As in the first laminates 2200, 2200' of FIG. 6d, instead of the second insulating layers 2310, 2310' and second copper foils 2320, 2320', second RCCs may be laminated on both sides of the substrate to form the second laminates 2300, 2300'.

Figure 6H:
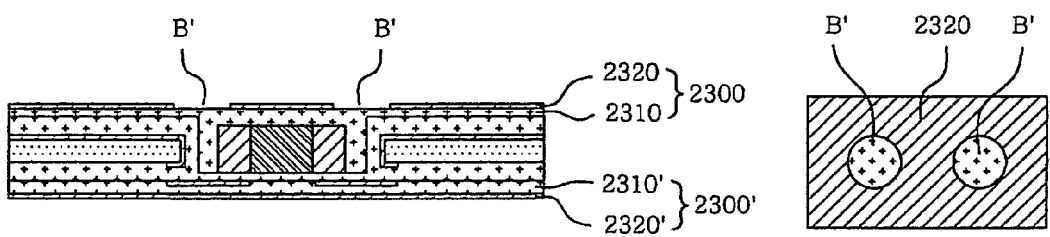

As shown in FIG. 6h, the upper second copper foil 2320 is exposed, developed, and etched using the etching resist made of the photosensitive material to form windows (B') for formation of the via holes.

Figure 6I:
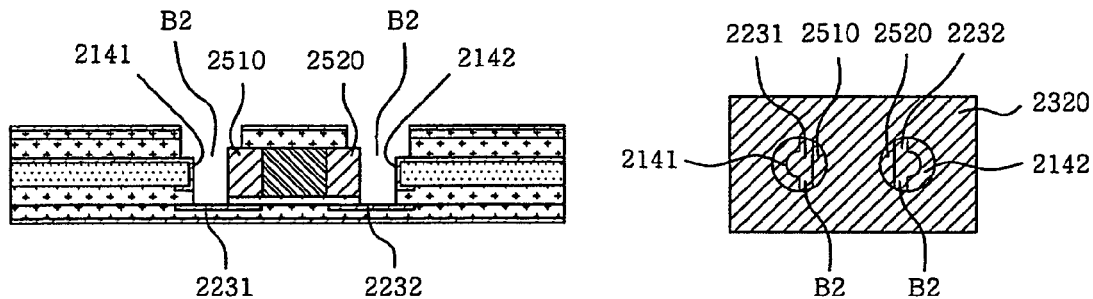

As shown in FIG. 6i, via holes (B2) are formed from the upper first copper foil 2320 to the lower via hole lands 2231, 2232 formed on the lower first copper foil 2220' of the first laminate 2200' using the windows (B') formed through the upper second copper foil 2320.

Since each of the via holes (B2) is a blind via hole having a closed lower end, it is preferable to drill the insulating layers 2210, 2210', 2310 using a laser drill to form the via holes (B2). At this time, preferable examples of the laser drill include a carbon dioxide laser drill. In this respect, since the electrodes 2510, 2520 of the passive component and terminals 2141, 2142, that is, walls of the via holes (B1), consist of copper which is not drilled by the carbon dioxide laser drill, the electrodes 2510, 2520 of the passive component and terminals 2141, 2142 act as a guide used to process the via holes (B2).

Figure 6J:
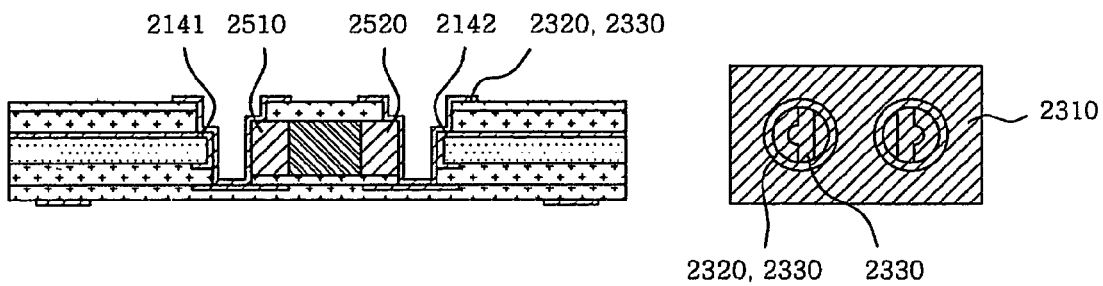

As shown in FIG. 6j, in order to electrically connect the terminals 2141, 2142 to the electrodes 2510, 2520 of the passive component, after the copper plating layers 2230, 2330' are formed on the walls of the via holes (i.e. terminals 2141, 2142), electrodes 2510, 2520 of the passive component, and upper and lower second copper foils 2320, 2320', exposure, development, and etching processes are conducted using an etching resist made of a photosensitive material. Thereby, predetermined circuit patterns are formed on the upper and lower second copper foils 2320, 2320' and copper plating layers 2330, 2330'.

The walls of the via holes (B2) each comprise the insulating resin layer, and thus, it is preferable to conduct an electrolytic copper plating process after the completion of an electroless copper plating process. At this time, physical properties of an electrolytic copper-plating layer are superior to those of an electroless copper-plating layer.

Furthermore, it is preferable that a dry film or a liquid photosensitive substance be used as the etching resist made of the photosensitive material to form the predetermined circuit patterns.

Figure 7A:
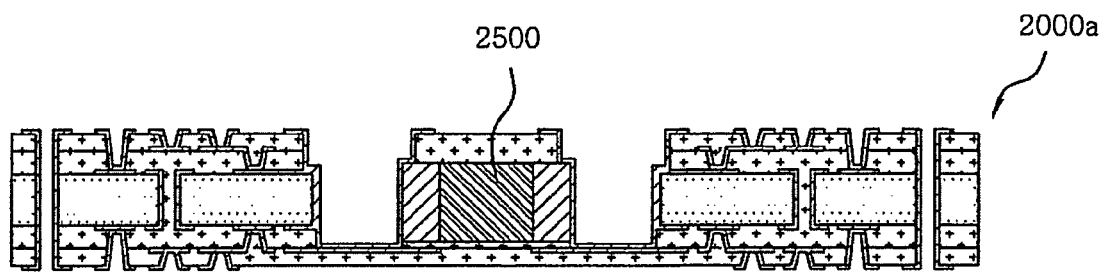
FIGS. 7a and 7b are sectional views of six- and eight-layered PCBs including embedded passive components, respectively, according to the embodiment of the present invention.
Figure 7B:
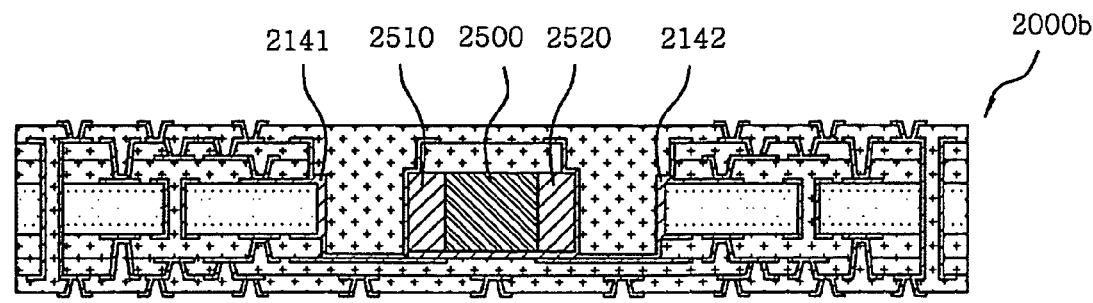

FIGS. 7a and 7b are sectional views of six- and eight-layered PCBs including embedded passive components according to the embodiment of the present invention, respectively.

As shown in FIG. 7a, the present invention may provide the six-layered PCB 2000a including the embedded passive component, in which the embedded passive component 2500 and traditional circuit patterns are formed simultaneously.

Furthermore, as shown in FIG. 7b, the present invention may provide the eight-layered PCB 2000b including the embedded passive component, in which the embedded passive component 2500 and traditional circuit patterns are formed simultaneously.

At this time, after an insulating layer (for example, prepreg) is packed in a space between the electrodes 2510, 2520 of the passive component and terminals 2141, 2142, additional circuit patterns may be formed.

As in the first embodiment of FIGS. 4a and 4b, the six- and eight-layered PCBs 2000a, 2000b including the embedded passive components, are described in the embodiment. However, as will be appreciated by those skilled in the art, the present invention may provide a PCB comprising eight or more layers and including an embedded passive component.

Figure 8:
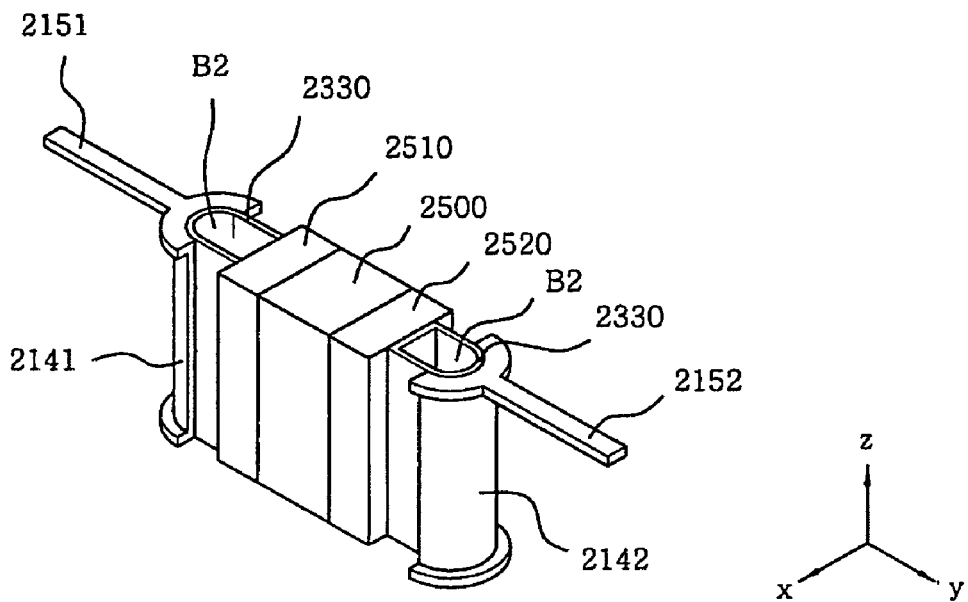
FIG. 8 is a perspective view of the embedded passive component according to the embodiment of the present invention.

FIG. 8 is a perspective view of the embedded passive component according to the embodiment of the present invention.

As shown in FIG. 8, the embedded passive component 2500 according to the present invention is embedded in an insulating layer of a PCB including the embedded passive component, and has electrodes 2510, 2520 formed on both sides thereof. The electrodes 2510, 2520 of the passive component are electrically connected through a copper plating layer 2330 to terminals 2141, 2142 separated therefrom by a predetermined distance. The terminals 2141, 2142 are portions of walls of the via holes (B2) each having a semi-cylindrical shape, and the copper plating layer 2330 is formed on the walls of the via holes (B2) to be electrically connected to circuit patterns 2151, 2152.

FIGS. 9a to 9h are sectional views illustrating the fabrication of PCBs including embedded passive components according to additional embodiments of the present invention.

Figure 9A:
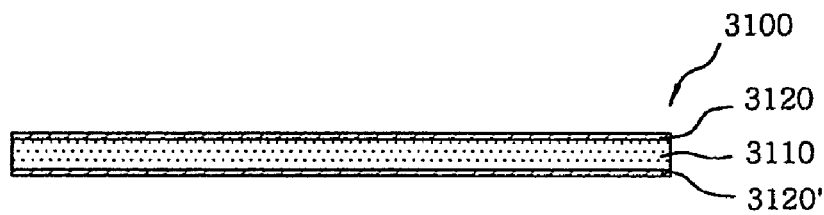
FIGS. 9a to 9h are sectional views illustrating the fabrication of PCBs including embedded passive components according to additional embodiments of the present invention.

As shown in FIG. 9a, a copper clad laminate as a substrate 3100 is provided, in which copper foil layers 3120, 3120' are applied on an insulating resin layer 3110.

As in the above embodiments, only a two-layered substrate 3100 is employed in the third and fourth embodiments. However, a substrate 3100 having a multi-layered structure, such as a four-, six-, or eight-layered structure, may be used depending on the purpose and application.

Figure 9B:
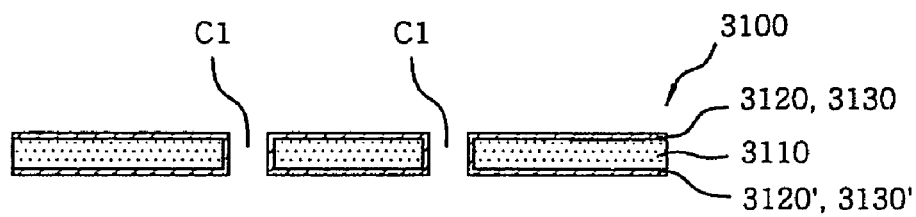

As shown in FIG. 9b, after two via holes (C1) are formed to achieve circuit connection between the upper and lower copper foil layers 3120, 3120' of the substrate 3100, copper plating layers 3330, 3330' are formed on the upper and lower copper foil layers 3120, 3120' and on walls of the via holes (C1) so as to electrically connect the via holes (C1) to each other.

As in the above embodiments, it is preferable to form the via holes (C1) through the substrate 3100 at predetermined positions using a mechanical drill such as a computer numerical control drill (CNC drill).

Furthermore, after the via holes (C1) are formed, it is preferable that a deburring process be conducted to remove burrs, generated during the drilling process, from the copper foil layers 3120, 3120', and dust adhering to the walls of the via holes (C1) and to surfaces of the copper foil layers 3120, 3120'. Additionally, it is preferable to conduct a desmear process so as to remove a smear which is formed on the walls of the via holes (C1) due to melting of the insulating resin layer 3110 by heat generated in the course of forming the via holes (C1).

Meanwhile, the walls of the via holes (C1) of the substrate 3100 each comprise the insulating resin layer 3110, and thus, it is preferable to form copper plating layers 3130, 3130' in such a way that an electrolytic copper plating process is conducted after the completion of an electroless copper plating process. At this time, physical properties of an electrolytic copper-plating layer are superior to those of electroless copper-plating layer.

Figure 9C:
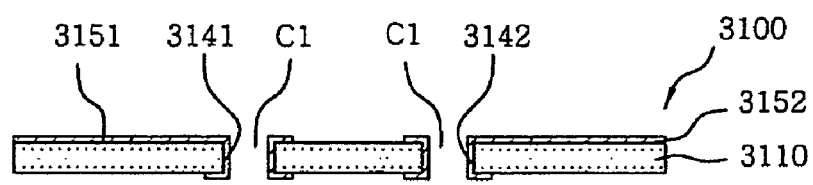

As shown in FIG. 9c, exposure, development, and etching processes are conducted using an etching resist made of a photosensitive material to form predetermined circuit patterns on the upper and lower copper foil layers 3120, 3120' and copper plating layers 3330, 3330' of the substrate 3100. The predetermined circuit patterns include traditional circuit patterns (not shown), lands of the via holes (C1) as a portion of terminals 3141, 3142, and circuit patterns 3151, 3152 connected to the terminals 3141, 3142.

Figure 9D:
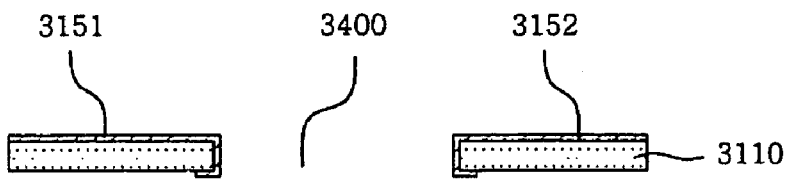

As shown in FIG. 9d, a portion between the two via holes (C1) is processed to form a receiving hole 3400 for receiving a passive component. At this time, it is preferable to form the receiving hole 3400 so that a half portion of each via hole (C1) is removed.

In the additional embodiments, the copper plating layers remain on opposite arciform wall portions of the two via holes positioned outside the receiving hole 3400 for receiving the passive component because the portions are not processed. Accordingly, the arciform portions act as the terminals 3141, 3142 connected to the electrodes of the passive component.

Furthermore, in the third and fourth embodiments, it is preferable to drill the portion of the substrate between the two via holes using a CNC drill, a router drill, or the like, so that a fine tolerance of the passive component to be mounted in the receiving hole is achieved.

Figure 9E:
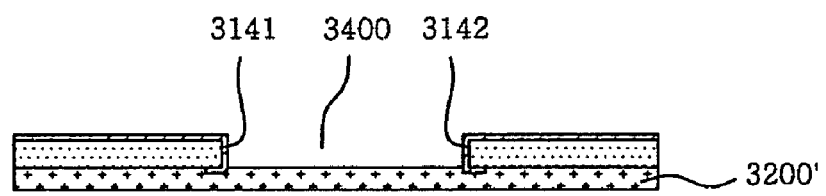

As shown in FIG. 9e, an insulating layer (for example, prepreg) is laminated as a first laminate 3200' on one side of the substrate 3100, heated and pressed at a predetermined temperature and pressure (for example, about 150-200° C. and 30-40 kg/cm²).

At this time, the insulating layer is laminated as the first laminate 3200' on one side of the substrate 3100 to prevent the passive component from falling from the receiving hole when the passive component is mounted in the receiving hole.

As an alternative to the first laminate 3200' being formed after the receiving hole 3400 for receiving the passive component is formed in FIGS. 9d to 9e, the receiving hole 3400 for receiving the passive component may be formed after the first laminate 3200' is formed.

Figure 9F:
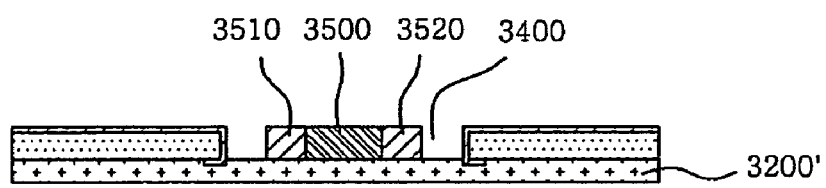

As shown in FIG. 9f, the passive component 3500, such as a chip capacitor or a chip resistor, is mounted in the receiving hole 3400 for receiving the passive component.

In this respect, it is preferable to mount the passive component 3500 in the receiving hole after a small amount of adhesive is applied in the bottom of the receiving hole 3400, so that the passive component 3500 is firmly fixed and remains in the correct position during subsequent processes.

Figure 9G:
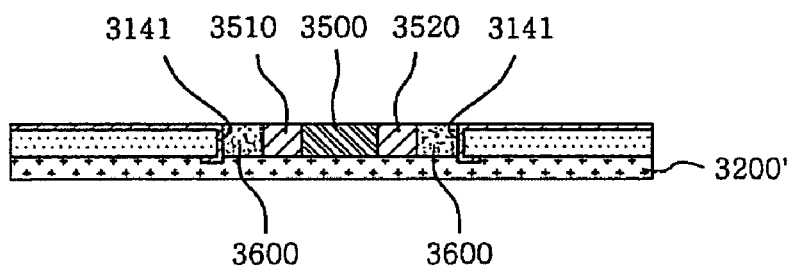

As shown in FIG. 9g, a conductive paste 3600 is packed in spaces between the terminals 3141, 3142 and electrodes 3510, 3520 of the passive component so as to electrically connect the terminals 3141, 3142 to the electrodes 3510, 3520 of the passive component.

Subsequently, a traditional PCB build-up process is conducted, thereby creating the PCB including the embedded passive component according to the third embodiment of the present invention.

Figure 9H:
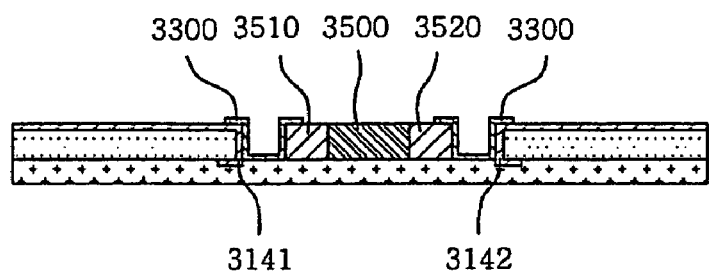

After the step of FIG. 9f, as shown in FIG. 9h, a copper plating layer 3300 may be formed between the terminals 3141, 3142 and electrodes 3510, 3520 of the passive component so as to electrically connect the terminals 3141, 3142 to the electrodes 3510, 3520 of the passive component.

Next, a traditional PCB build-up process is conducted, thereby creating the PCB including the embedded passive component according to an embodiment of the present invention.

Figure 10A:
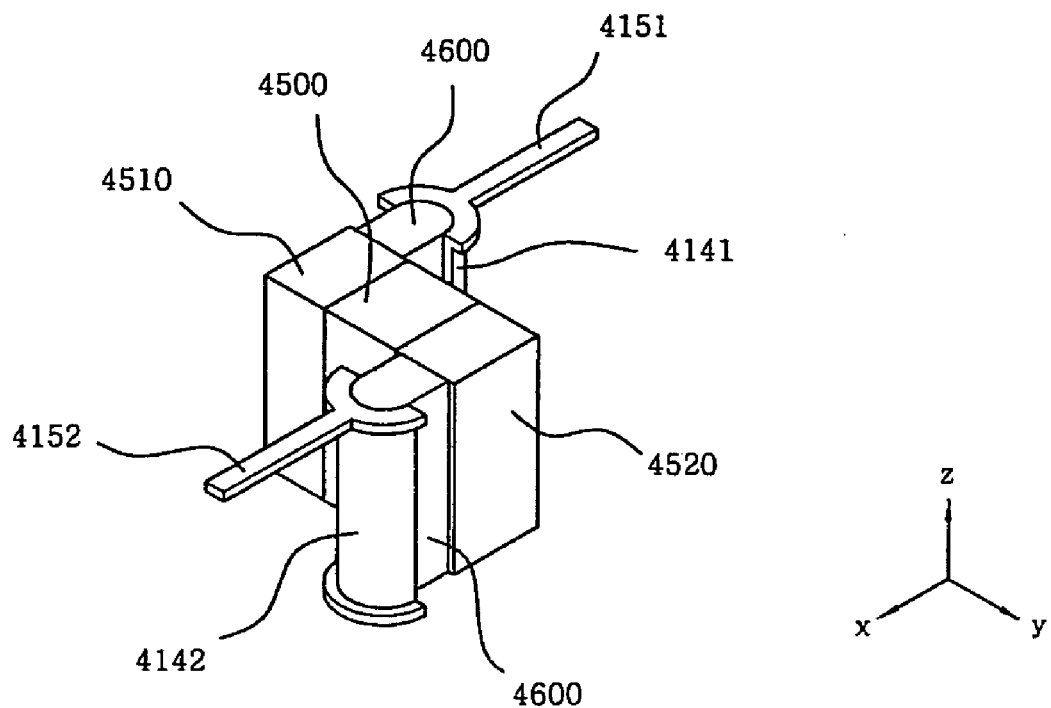
FIGS. 10a and 10b are perspective views of embedded passive components according to further embodiments of the present invention, respectively.
Figure 10B:
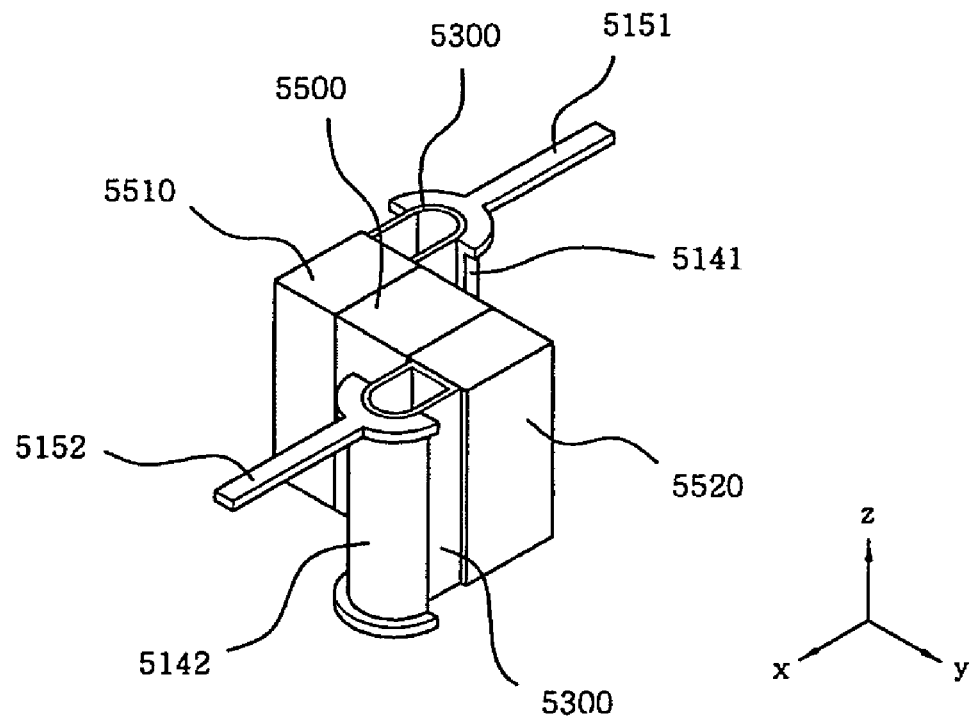

FIGS. 10a and 10b are perspective views of embedded passive components according to further embodiments of the present invention.

As shown in FIG. 10a, the embedded passive component 4500 according to an embodiment of the present invention is embedded in an insulating layer of a PCB including the embedded passive component, and has electrodes 4510, 4520 formed on both sides thereof. The electrodes 4510, 4520 of the passive component are electrically connected through a conductive paste 4600 to terminals 4141, 4142 separated therefrom by a predetermined distance. The terminals 4141, 4142 are portions of walls of the via holes each having a semi-cylindrical shape, and copper plating layers are formed on the walls of the via holes to be electrically connected to circuit patterns 4151, 4152.

When the embedded passive component 1500 according to the above embodiment of the present invention as shown in FIG. 5 is compared to the embedded passive component 4500 according to this embodiment of the present invention as shown in FIG. 10a, the terminals 1141, 1142 are connected (in ±y-axial directions) through the conductive paste 1600, which is separated from the embedded passive component 1500, to surfaces of the electrodes 1510, 1520 of the passive component in the first embodiment. In the fifth embodiment, the terminals 4141, 4142 are connected (in ±x-axial directions) through the conductive paste 4600, which is in contact with the embedded passive component 4500, to surfaces of the electrodes 4510, 4520 of the passive component.

As shown in FIG. 10b, the embedded passive component 5500 according to another embodiment of the present invention is embedded in an insulating layer of a PCB including the embedded passive component, and has electrodes 5510, 5520 formed on both sides thereof. The electrodes 5510, 5520 of the passive component are electrically connected through copper plating layers 5300 to terminals 5141, 5142 separated therefrom by a predetermined distance. The terminals 5141, 5142 are portions of walls of the via holes each having a semi-cylindrical shape, and copper plating layers are formed on the walls of the via holes to be electrically connected to circuit patterns 5151, 5152.

When the embedded passive component 2500 according to the above embodiment of the present invention as shown in FIG. 8 is compared with the embedded passive component 5500 according to another embodiment of the present invention as shown in FIG. 10b, the terminals 2141, 2142 are connected (in ±y-axial directions) through the copper plating layers 2330, which are separated from the embedded passive component 2500, to surfaces of the electrodes 2510, 2520 of the passive component in the second embodiment. In the sixth embodiment, the terminals 5141, 5142 are connected (in ±x-axial directions) through the copper plating layers 5330, which are in contact with the embedded passive component 5500, to surfaces of the electrodes 5510, 5520 of the passive component.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

As described above, the present invention provides a PCB including an embedded passive component, in which the passive component is mounted in a predetermined receiving hole for communicating with via holes, and in which walls of the via holes are used as terminals, and a method of fabricating the same.

Therefore, the PCB including the embedded passive component and method of fabricating the same according to the present invention are advantageous in that the walls of the via holes functioning as terminals are electrically connected to electrodes of the passive component using a conductive paste or a copper plating layer, thereby assuring easy and accurate electrical connection.

Another advantage of the present invention is that various sizes of passive components, such as chip capacitors or chip resistors, are embedded in the PCB, resulting in improved freedom in designing the PCB.

Still another advantage of the present invention is that a surface mounting area of the PCB increases because the passive component is embedded in the PCB, making the mounting of additional electronic parts or miniaturization of the PCB possible.

A further advantage of the present invention is that additional circuit layers can be formed after the passive component is embedded in the PCB, thereby contributing to miniaturization, high integration, and multi-functionalization of electronic goods.

Yet another advantage of the present invention is that when the via holes are electrically connected to the passive component using the conductive paste, other via holes can be formed on the via holes, resulting in improved integration of circuits.

What is claimed is:

1. A method of fabricating a printed circuit board including an embedded passive component, comprising the steps of:

forming a plurality of first via holes through a substrate, and forming copper plating layers on an external layer of the substrate and on walls of the first via holes;

forming first circuit patterns which include lands of the first via holes, on the external layer of the substrate and copper plating layers, and circuit patterns connected to the lands of the first via holes;

laminating first laminates, which each include a first insulating layer and a first copper foil, on both sides of the substrate, and forming second circuit patterns on the first copper foil of each of the first laminates;

forming a receiving hole for receiving the passive component by removing a portion between the two first via holes of the plurality of first via holes so that the two via holes communicate with each other;

mounting the passive component in the receiving hole;

laminating second laminates, which each include a second insulating layer and a second copper foil, on the first laminates, and forming second via holes so as to expose the portion of the two first via holes that is not removed, and the electrodes of the passive component; and electrically connecting a portion of the two first via holes, which is not removed, to electrodes of the passive component.

2. The method as set forth in claim 1, further comprising the steps of laminating an insulating layer on one side of the substrate after the step of forming first circuit patterns.

3. The method as set forth in claim 1, further comprising the steps of laminating an insulating layer on one side of the substrate after the step of forming a receiving hole.

4. The method as set forth in claim 1, wherein the second circuit patterns of the step laminating first laminates comprise lower lands of the second via holes formed on the lower first copper foils of the first laminates, to prevent over-etching in a course of forming the second via holes in the step of laminating second laminates.

5. The method as set forth in claim 1, wherein the forming of the receiving hole is conducted using a computer numerical control drill (CNC drill) in the step of forming a receiving hole.

6. The method as set forth in claim 1, wherein the forming of the receiving hole is conducted using a router drill in the step of forming a receiving hole.

7. The method as set forth in claim 1, wherein the portion of the first via holes that is not removed, is electrically connected to the electrodes of the passive component using a conductive paste in the step of electrically connecting a portion of the two first via holes.

8. The method as set forth in claim 1, wherein the portion of the first via holes that is not removed, is electrically connected to the electrodes of the passive component using the copper plating layers in the step of electrically connecting a portion of the two first via bolts.

* * * * *